United States Patent [19]

Lambeth

[11] Patent Number: 4,826,312
[45] Date of Patent: May 2, 1989

[54] LARGE AREA, LOW CAPACITANCE PHOTODIODE AND RANGE FINDER DEVICE USING SAME

[75] Inventor: David N. Lambeth, Webster, N.Y.

[73] Assignee: Eastman Kodak Company, Rochester, N.Y.

[21] Appl. No.: 797,096

[22] Filed: Nov. 12, 1985

[51] Int. Cl.[4] ............................ G01C 3/00; G03B 3/00
[52] U.S. Cl. .......................................... 356/1; 354/403
[58] Field of Search ............................ 356/1; 354/403; 340/173

[56] References Cited

U.S. PATENT DOCUMENTS

| 3,771,149 | 11/1973 | Collins et al. | 340/173 |
| 4,490,036 | 12/1984 | Anagnostopoulos | 354/403 |
| 4,490,037 | 12/1984 | Anagnostopoulos et al. | 354/403 |
| 4,521,106 | 6/1985 | Lambeth | 356/1 |

Primary Examiner—Russell E. Adams
Attorney, Agent, or Firm—Donald D. Schaper

[57] ABSTRACT

An infrared sensitive photodiode having a relatively large optically active area and relatively low capacitance comprises a stripe diode adjacent an optically active area having a thick infrared transparent field oxide over a lightly doped channel stop. The low capacitance photodiode is particularly useful in a range finder device of the type having means for projecting a beam of light to illuminate a spot on an object in a scene, and a linear array of photosensors for detecting the apparent location of the spot in the scene to determine the distance to the object. An improved range finder of this type has an infrared LED with a long narrow beam cross section and an array of stripe photodiodes having shapes similar to the shape of the beam cross section.

1 Claim, 2 Drawing Sheets

LARGE AREA, LOW CAPACITANCE PHOTODIODE AND RANGE FINDER DEVICE USING SAME

FIELD OF THE INVENTION

The invention relates to a photodiode structure for use in apparatus requiring a large area, low capacitance photodiode, and to a range finder device employing the photodiode.

BACKGROUND OF THE INVENTION

It is well known to employ photodiodes in a variety of light measurement apparatus. U.S. Pat. No. 4,521,106 discloses a range finder device useful, for example, in automatic focusing photographic cameras and including a linear array of photodiodes.

The general arrangement of elements and mode of operation of such a range finder device will be described with reference to FIG. 3. Means are provided for projecting a beam of light, for example an infrared light-emitting diode (LED) 10 and a lens 12, along a path 14 to illuminate a spot on an object $0_1$ in a scene. The scene is imaged by a second lens 16 onto a linear array of photodiodes 18. The signals produced by the photodiodes are analyzed by signal processing electronics 20 to determine the position of the illuminated spot in the scene and produce a signal representing the distance to the object.

As shown by example in FIG. 3, the apparent position of the illuminated spot in the scene is a function of the distance along light path 14 to the object. For an object $0_1$ located at a distance $D_1$ from the range finder device, the image of the illuminated spot will fall on the photodiode array at location $S_1$. For an object $0_2$ at a further distance $D_2$, the image of the spot will fall on the photodiode array at location $S_2$. By examining the output of the photodiode array, the control electronics 20 determines (for example by comparing the outputs of the photodiodes to determine that output which is a maximum) the location of the illuminated spot in the scene and thereby the distance to the object. To remove the effects of the scene brightness modulation, the range finder device is operated once with the LED on, and again with the LED off. The respective responses of the individual photodiodes are then subtracted from each other to obtain a signal representing only the illuminated spot. FIG. 4 shows a linear image sensor 18 useful with the range finder device. The image sensor 18 includes a linear array of photodiodes 22 and a charge coupled device (CCD) shift register 24. The CCD shift register has 2N cells labeled 1a, 1b, 2a, 2b, ... Na,Nb. A transfer gate 26 between the array of photodiodes 22 and CCD shift register 24 is actuable for transferring photocharge (in the direction of arrow A) rom the photodiodes into alternate cells of the CCD shift register 24. A second transfer gate 32 between the photodiode array and a reset drain 28 is actuable for transferring charge on the photodiodes (in the direction of arrow B) into a reset diode 28. The CCD shift register is a buried channel CCD and the transfer channels created by the transfer gates 26 and 32 are surface channels.

The signals in the CCD shift register 24 are shifted serially in the direction of arrow C to an output diode 34 by applying four-phase clock signals $\Phi_{1-4}$ to the transfer electrodes (not shown) of the CCD shift register The photosignals are detected at the output by a preamplifier 36.

In operation, the range finder device is operated once with the LED on, and the detected photosignals are transferred into alternate cells of CCD shift register 24. The photocharges are shifted one cell to the right (as seen in FIG. 4). Then the device is operated with the LED off, and the detected photosignals are likewise transferred into CCD 24. Photosignals are then shifted to the right as seen in FIG. 4 by applying four-phase clock signals $\Phi_{1-4}$ to the transfer electrodes of the CCD shift registers. The photosignals are detected at the output diode 34 and amplified by preamplifier 36 before successive pairs are subtracted from each other by signal processing electronics 20.

Patent Application No. 797,093 filed on even date herewith by the present inventor discloses an improved method for introducing charge into the CCD shift register to provide a FAT ZERO. According to this method, the photodiodes 22 are employed as metering wells in a "time dependent" fill and spill process. The photodiodes are charged by pulsing the reset drain 28, and allowing charge to boil back over the potential barrier created by transfer gate $T_2$ for a time $t_1$. Then transfer gate $T_2$ is raised and transfer gate $T_2$ is lowered to the same level that $T_2$ was previously lowered to, and charge is allowed to boil out of the photodiode over the potential barrier provided by transfer gate $T_1$ for a time $t_2$. The resulting charge Q transferred to the CCD is approximately:

$$Q = \frac{CkT \ln t_2/t_1}{q} \quad (1)$$

where C is the capacitance of the diode, k is the Boltzmann constant ($1.8 \times 10^{-23}$ joules/degree Kelvin), T is the temperature in degrees Kelvin and q is the charge on an electron.

In developing this range finder device for use in a photographic camera, the inventor has found that an LED 10 producing a relatively long, narrow beam cross section (e.g. 100 μm×1000 μm) is particularly well suited for the light source. To optimize the signal-to-noise ratio of the range finder device, it is desirable that the photodiodes 22 have a size and shape similar to the size and shape of the beam cross section (e.g. 100 μm×1000 μm). Unfortunately, photodiodes of this size and shape have a much higher capacitance than the smaller more nearly square (e.g. 100×50 μm) diodes used in the prior art device. As seen from equation (1), the amount of charge Q transferred to the CCD shift register during the generation of a FAT ZERO by the "time dependent" spill and fill process is directly proportional to the capacitance C of the photodiode. Because of the large capacitance of the larger photodiodes, the times employed in the time dependent spill and fill process become extremely short, and difficult to accurately control.

Accordingly, it is the object of the present invention to provide a photodiode structure having relatively large light sensitive area and a relatively low capacitance. A further object of the invention is to provide a linear image sensing array and an improved range finder device of the type described above, having such photodiodes.

DISCLOSURE OF THE INVENTION

The objects of the invention are achieved by providing an infrared sensitive photodiode in the shape of a narrow stripe, with an optically active area adjacent the narrow stripe diode covered with a thick infrared transparent field oxide overlying a lightly doped channel stop. In a preferred mode of practicing the invention, the narrow stripe defines the outline of a rectangle.

A range finder device according to the present invention includes an LED having a long narrow light emitting region, and a linear array of photodiodes having a light sensitive region similar to the long narrow emitting region of the LED, the photodiodes being in the shape of a narrow stripe with an optically active region covered with thick field oxide overlying a lightly doped channel stop adjacent the stripe. In the preferred mode, the narrow stripe diodes in the range finder define rectangles.

MODES OF CARRYING OUT THE INVENTION

Figure 1:
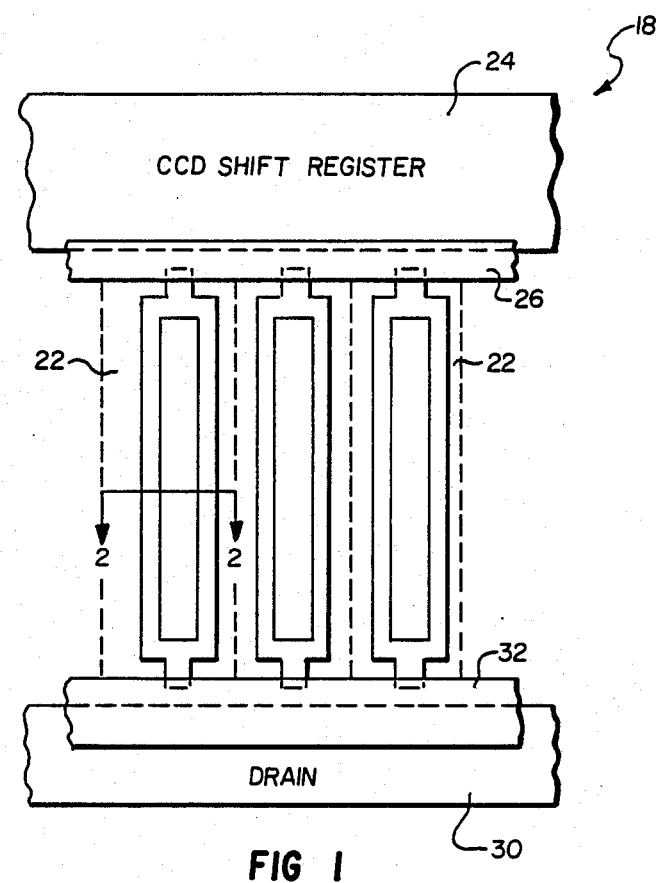
FIG. 1 is a partial plan view showing the structure of the photodiode according to the present invention.
Figure 2:
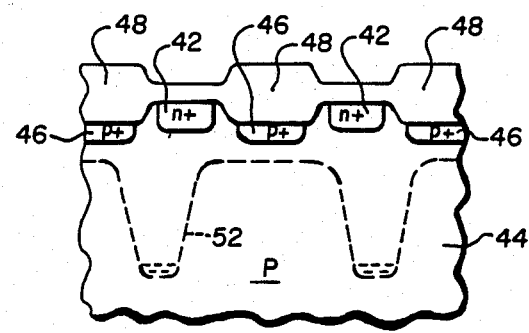
FIG. 2 is a schematic cross-sectional view and potential diagram of the diode shown in FIG. 1 taken along line 2—2 in FIG. 1.
Figure 3:
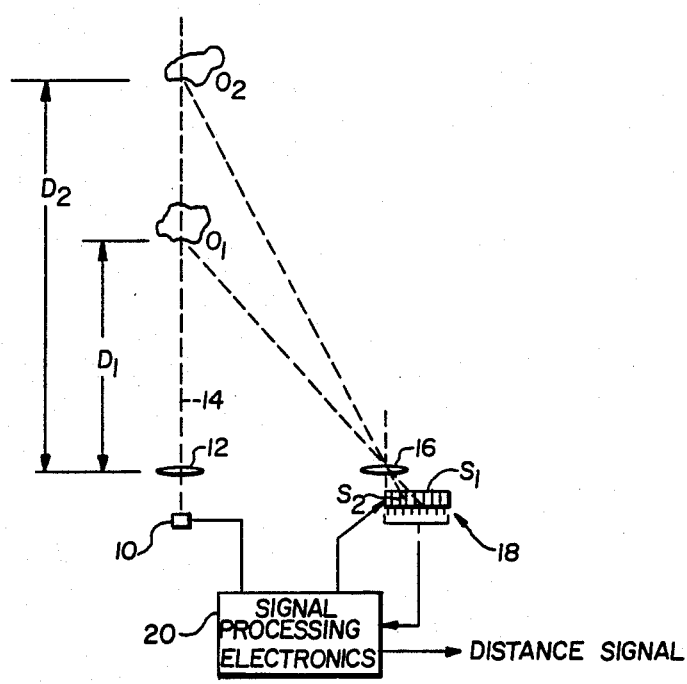
FIG. 3 is a schematic diagram of a prior art range finder device having a linear array of photosensors.
Figure 4:
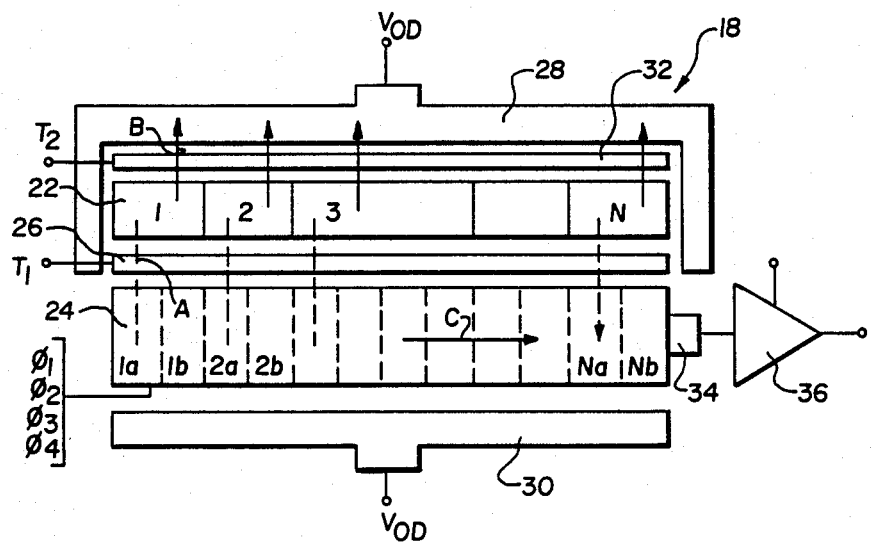
FIG. 4 is a schematic diagram of a prior art linear photodiode array used in the range finder device shown in FIG. 3.

FIG. 1 is a schematic diagram showing a portion of a linear photodiode array 18 of the type shown in FIG. 4 wherein elements similar to elements shown in FIG. 4 are similarly numbered. The photodiodes 22 according to the present invention are long narrow stripes surrounded by an optically active region covered with thick field oxide transparent to infrared light, overlying a lightly doped channel stop. FIG. 2 shows a cross section of one of the diodes taken along line 2—2 in FIG. 1. The diode 22 comprises for example a region of n+ type impurity 42 in a p type silicon substrate 44. The optically active regions between the diode stripes are conventional channel stopping regions comprising for example a region of p+ type impurities 46 covered by thick field oxide 48.

By shaping the diode in this way, i.e. a narrow stripe adjacent an optically active region covered by thick field oxide, the area of the optically active region is large, but the area and hence the capacitance of the photodiode is considerably reduced compared to a conventional photodiode having the same optically active area. The photodiode array is readily constructed employing conventional silicon integrated circuit fabrication techniques.

When an infrared photon generates an electron-hole pair in the silicon substrate under the channel stopping region, the channel stop reflects the carriers back into the substrate. The carriers move back into the bulk silicon and wander randomly until they either recombine or are captured by the depletion region of the diode, indicated by the potential well 52 outlined in FIG. 2.

The overall collection efficiency, at infrared wavelengths, of such a stripe geometry infrared photodiode in silicon having a denuded zone 80 $\mu$m deep and a field oxide 1.7 $\mu$m thick was modeled on a computer and found to be only approximately 25% less than the collection efficiency of a conventional nonstripe diode having the same outside dimensions. On the other hand, the capacitance of the stripe diode was reduced by a factor of about 3, thereby improving the overall performance of the range finder device in which the stripe geometry diode is used. Although the preferred mode of practicing the invention has been described in a range finder device having rectangular photodiodes, the usefulness of the stripe diode geometry is not limited to a rectangular configuration, as circular, oval and odd shaped outlines are readily constructed with the same consequent advantages of a large optically active area and low capacitance. Also, it is not necessary that the stripe diode completely surround the optically active region, as a fork shaped stripe diode having optically active regions between the tines of the fork shape also achieves the advantages of the invention.

INDUSTRIAL APPLICABILITY AND ADVANTAGES

The stripe geometry diodes of the present invention are useful in photodetecting apparatus requiring infrared sensitive photodiodes with relatively large optically active areas and relatively low capacitance, such as a range finder apparatus having an array of photosensors for detecting the location of a projected spot of infrared light in a scene.

The stripe photodiode according to the invention is advantageous in that it has a relatively large optically active region and a relatively small capacitance, thereby facilitating an improvement in the signal-to-noise ratio of the detecting apparatus.

A range finder device having an LED with a long narrow beam cross section and a photodiode array having stripe photodiodes with optically active areas having shapes similar to the shape of the beam cross section is advantageous in that the sensitivity and reliability of the distance measurements made by the range finder are improved.

I claim:

1. An infrared sensitive photodiode, comprising:
   a semiconductor substrate having a first type impurity;
   a diode region of a second type of impurity in the substrate, defining a narrow stripe; and
   an optically active region comprising an infrared transparent thick oxide over a light implant of said first impurity type, adjacent said narrow stripe diode region,
   whereby an infrared photodiode having a relatively large optically active region and a relatively small capacitance is provided.

* * * * *